(12) United States Patent
Moon et al.

(10) Patent No.: US 9,356,007 B2
(45) Date of Patent: May 31, 2016

(54) LIGHT EMITTING DEVICE AND LIGHTING APPARATUS INCLUDING THE SAME

(71) Applicant: LG INNOTEK CO., LTD., Seoul (KR)

(72) Inventors: Ji Hyung Moon, Seoul (KR); Sang Youl Lee, Seoul (KR); Young kyu Jeong, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 0 days.

(21) Appl. No.: 14/499,459

(22) Filed: Sep. 29, 2014

(65) Prior Publication Data

US 2015/0014713 A1 Jan. 15, 2015

Related U.S. Application Data

(63) Continuation of application No. 13/370,601, filed on Feb. 10, 2012, now Pat. No. 8,884,312.

(30) Foreign Application Priority Data

Oct. 10, 2011 (KR) .................. 10-2011-0102836

(51) Int. Cl.
*H01L 29/18* (2006.01)
*H01L 21/00* (2006.01)
(Continued)

(52) U.S. Cl.
CPC .............. *H01L 25/13* (2013.01); *H01L 33/20* (2013.01); *H01L 33/382* (2013.01);
(Continued)

(58) Field of Classification Search
CPC ..... H01L 25/048; H01L 27/288; H01L 27/30; H01L 27/32; H01L 27/3239; H01L 31/143; H01L 31/162; H01L 33/06; H01L 33/08; H01L 33/18; H01L 33/24; H01L 33/26; H01L 51/0032; H01L 51/50
USPC ................ 438/22–47, 69, 493, 503, 507, 956
See application file for complete search history.

(56) References Cited

U.S. PATENT DOCUMENTS 8,956,897 B2 2/2015 Rode et al.
8,956,987 B2 2/2015 Rode et al.
(Continued)

FOREIGN PATENT DOCUMENTS

CN 101165931 A 4/2008
CN 102067343 A 5/2011
(Continued)

OTHER PUBLICATIONS

U.S. Office Action dated Mar. 29, 2013 issued in U.S. Appl. No. 13/370,601.
(Continued)

*Primary Examiner* — Selim Ahmed
*Assistant Examiner* — Moin Rahman
(74) *Attorney, Agent, or Firm* — KED & Associates LLP

(57) ABSTRACT

A light emitting device is disclosed. The disclosed light emitting device includes a light emitting structure including a first-conductivity-type semiconductor layer, an active layer, and a second-conductivity-type semiconductor layer, a second electrode layer disposed beneath the light emitting structure and electrically connected to the second-conductivity-type semiconductor layer, a first electrode layer including a main electrode disposed beneath the second electrode layer, and at least one contact electrode branching from the main electrode and extending through the second electrode layer, the second-conductivity-type semiconductor layer and the active layer, to contact the first-conductivity-type semiconductor layer, and an insulating layer interposed between the first electrode layer and the second electrode layer and between the first electrode layer and the light emitting structure. The first-conductivity-type semiconductor layer includes a first region and a second region having a smaller height than the first region, and the first region overlaps with the contact electrode.

19 Claims, 18 Drawing Sheets

(51) Int. Cl.

| | | |
|---|---|---|
| *H01L 25/13* | (2006.01) | |
| *H01L 33/20* | (2010.01) | |
| *H01L 33/38* | (2010.01) | |
| *H01L 33/40* | (2010.01) | |
| *H01L 33/44* | (2010.01) | |
| *H01L 33/62* | (2010.01) | |
| *H01L 33/64* | (2010.01) | |
| *F21K 99/00* | (2016.01) | |
| *H01L 33/00* | (2010.01) | |
| *H01L 33/22* | (2010.01) | |
| *H01L 33/48* | (2010.01) | |
| *F21Y 101/02* | (2006.01) | |
| *F21V 29/83* | (2015.01) | |

(52) U.S. Cl.
  CPC ............ *H01L 33/405* (2013.01); *H01L 33/44* (2013.01); *H01L 33/62* (2013.01); *H01L 33/64* (2013.01); *F21K 9/13* (2013.01); *F21V 29/83* (2015.01); *F21Y 2101/02* (2013.01); *H01L 33/0079* (2013.01); *H01L 33/22* (2013.01); *H01L 33/387* (2013.01); *H01L 33/486* (2013.01); *H01L 2924/0002* (2013.01)

(56) References Cited

U.S. PATENT DOCUMENTS

| | | | | |
|---|---|---|---|---|
| 2006/0280215 | A1* | 12/2006 | Son et al. | 372/46.01 |
| 2008/0142824 | A1 | 6/2008 | Chen et al. | 257/98 |
| 2009/0078952 | A1* | 3/2009 | Horng et al. | 257/98 |
| 2010/0127295 | A1 | 5/2010 | Kim et al. | 257/98 |
| 2010/0200884 | A1* | 8/2010 | Lee et al. | 257/98 |
| 2010/0213481 | A1 | 8/2010 | Hwang | |
| 2010/0220463 | A1 | 9/2010 | Kim et al. | 362/97.3 |
| 2010/0264443 | A1 | 10/2010 | Wakai et al. | 257/98 |
| 2011/0193123 | A1 | 8/2011 | Moon et al. | |
| 2011/0210362 | A1* | 9/2011 | Lee et al. | 257/98 |
| 2011/0272728 | A1* | 11/2011 | Rode et al. | 257/99 |
| 2013/0221392 | A1 | 8/2013 | Engl et al. | |
| 2014/0197435 | A1 | 7/2014 | Maute et al. | |

FOREIGN PATENT DOCUMENTS

| | | |
|---|---|---|
| EP | 2 320 138 A2 | 5/2011 |
| EP | 2 348 551 A2 | 7/2011 |
| EP | 2 408 030 A2 | 1/2012 |
| EP | 2 715 809 A2 | 4/2014 |
| JP | 2010-050157 A | 3/2010 |
| JP | 2010-157751 A | 7/2010 |
| JP | 2010-525585 A | 7/2010 |
| JP | 2011-166150 A | 8/2011 |
| JP | 2011-525708 A | 9/2011 |

OTHER PUBLICATIONS

U.S. Notice of Allowance dated Jul. 9, 2014 issued in U.S. Appl. No. 13/370,601.

Japanese Office Action for Application 2012-029681 dated Sep. 25, 2015.

Extended European Search Report dated Feb. 5, 2016 for Application 12162167.6.

Chinese Office Action for Application 201210171651.8 dated Mar. 25, 2016 (full Chinese text).

* cited by examiner

LIGHT EMITTING DEVICE AND LIGHTING APPARATUS INCLUDING THE SAME

CROSS REFERENCE TO RELATED APPLICATIONS

The present application is a continuation of U.S. application Ser. No. 13/370,601, filed Feb. 10, 2012, which claims priority under 35 U.S.C. §119 to Korean Patent Application No. 10-2011-0102836, filed in Korea on Oct. 10, 2011, which are hereby incorporated in their entirety.

TECHNICAL FIELD

Embodiments relate to a light emitting device and a lighting apparatus including the same.

BACKGROUND

Light emitting devices, such as light emitting diodes (LEDs) and laser diodes (LDs), which use a Group III-V or Group II-VI compound semiconductor material, may render various colors such as red, green, blue, and ultraviolet by virtue of development of thin film growth technologies and device materials. It may also be possible to produce white light at high efficiency using fluorescent materials or through color mixing. Further, the light emitting devices have advantages, such as low power consumption, semi-permanent lifespan, fast response time, safety, and environmental friendliness as compared to conventional light sources, such as fluorescent lamps and incandescent lamps.

Therefore, these light emitting elements are increasingly applied to transmission modules of optical communication units, light emitting diode backlights as a replacement for cold cathode fluorescent lamps (CCFLs) constituting backlights of liquid crystal display (LCD) devices, and lighting apparatuses using white light emitting diodes as a replacement for fluorescent lamps or incandescent lamps, headlights for vehicles and traffic lights.

In the case of a light emitting device having a via hole, the thickness thereof is greater than that of a light emitting device having a semiconductor layer with a general thickness. For this reason, the length of a path, along which light generated from an active layer travels before being outwardly emitted, is long, so that the amount of light absorbed in the semiconductor layer disposed over the active layer increases. As a result, the light extraction efficiency of the light emitting device may be degraded.

SUMMARY

Embodiments achieve an enhancement in the light extraction efficiency of a light emitting device through a reduction in the thickness of a semiconductor layer included in the light emitting device.

In one embodiment, a light emitting device includes a light emitting structure including a first-conductivity-type semiconductor layer, an active layer, and a second-conductivity-type semiconductor layer, a second electrode layer disposed beneath the light emitting structure and electrically connected to the second-conductivity-type semiconductor layer, a first electrode layer including a main electrode disposed beneath the second electrode layer, and at least one contact electrode branching from the main electrode and extending through the second electrode layer, the second-conductivity-type semiconductor layer and the active layer, to contact the first-conductivity-type semiconductor layer, and an insulating layer interposed between the first electrode layer and the second electrode layer and between the first electrode layer and the light emitting structure, wherein the first-conductivity-type semiconductor layer includes a first region and a second region having a smaller height than the first region, and the first region overlaps with the contact electrode.

The first region may have a width equal to or greater than a width of the contact electrode.

The width of the first region may correspond to 1 to 5 times the width of the contact electrode.

A roughness or a pattern may be formed at an upper surface of the first-conductivity-type semiconductor layer.

The light emitting device may further include a passivation layer formed on side surfaces of the light emitting structure, to cover at least a portion of the second-conductivity-type semiconductor layer, at least a portion of the active layer, and at least a portion of the first-conductivity-type semiconductor layer. A roughness may be formed at a portion of the contact electrode contacting the first-conductivity-type semiconductor layer.

A portion of the second electrode layer may be exposed outside the light emitting structure, and an electrode pad may be formed on the exposed portion of the second electrode layer.

The second electrode layer may include an ohmic layer and/or a reflective layer disposed beneath the second-conductivity-type semiconductor layer.

The second electrode layer may include a current spreading layer, and the electrode pad may be disposed to contact the current spreading layer.

The light emitting device may further include a passivation layer formed on side surfaces of the first region.

The first region may have at least one of a stripe shape, a circular prism shape, a conical shape, a pyramid shape, a square prism shape, and a hemi-spherical shape.

In another embodiment, a light emitting device includes a light emitting structure including a first-conductivity-type semiconductor layer, an active layer, and a second-conductivity-type semiconductor layer, which are stacked in a predetermined direction, a second electrode layer disposed beneath the light emitting structure and electrically connected to the second-conductivity-type semiconductor layer, a first electrode layer including a main electrode disposed beneath the second electrode layer, and at least one contact electrode branching from the main electrode and extending through the second electrode layer, the second-conductivity-type semiconductor layer and the active layer, to contact the first-conductivity-type semiconductor layer, and an insulating layer interposed between the first electrode layer and the second electrode layer and between the first electrode layer and the light emitting structure, wherein the first-conductivity-type semiconductor layer includes a first region and a second region having a smaller thickness than the first region, and the first region overlaps with the contact electrode in the predetermined direction.

In another embodiment, a lighting apparatus includes a light source for emitting light, the light source including a plurality of light emitting device packages mounted on a circuit board, a housing, in which the light source is mounted, a heat dissipation unit to dissipate heat generated from the light source, and a holder for coupling the light source and the heat dissipation unit to the housing, wherein each of the light emitting device packages includes a body, first and second lead frames disposed on the body, and a light emitting device disposed on the body and electrically connected to the first and second lead frames, wherein the light emitting device includes a light emitting structure including a first-conductivity-type semiconductor layer, an active layer, and a second-conductivity-type semiconductor layer, which are stacked in a predetermined direction, a second electrode layer disposed beneath the light emitting structure and electrically connected to the second-conductivity-type semiconductor layer, a first electrode layer including a main electrode disposed beneath the second electrode layer, and at least one contact electrode branching from the main electrode and extending through the second electrode layer, the second-conductivity-type semiconductor layer and the active layer, to contact the first-conductivity-type semiconductor layer, and an insulating layer interposed between the first electrode layer and the second electrode layer and between the first electrode layer and the light emitting structure, and wherein the first-conductivity-type semiconductor layer includes a first region and a second region having a smaller thickness than the first region, and the first region overlaps with the contact electrode in the predetermined direction.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1A:
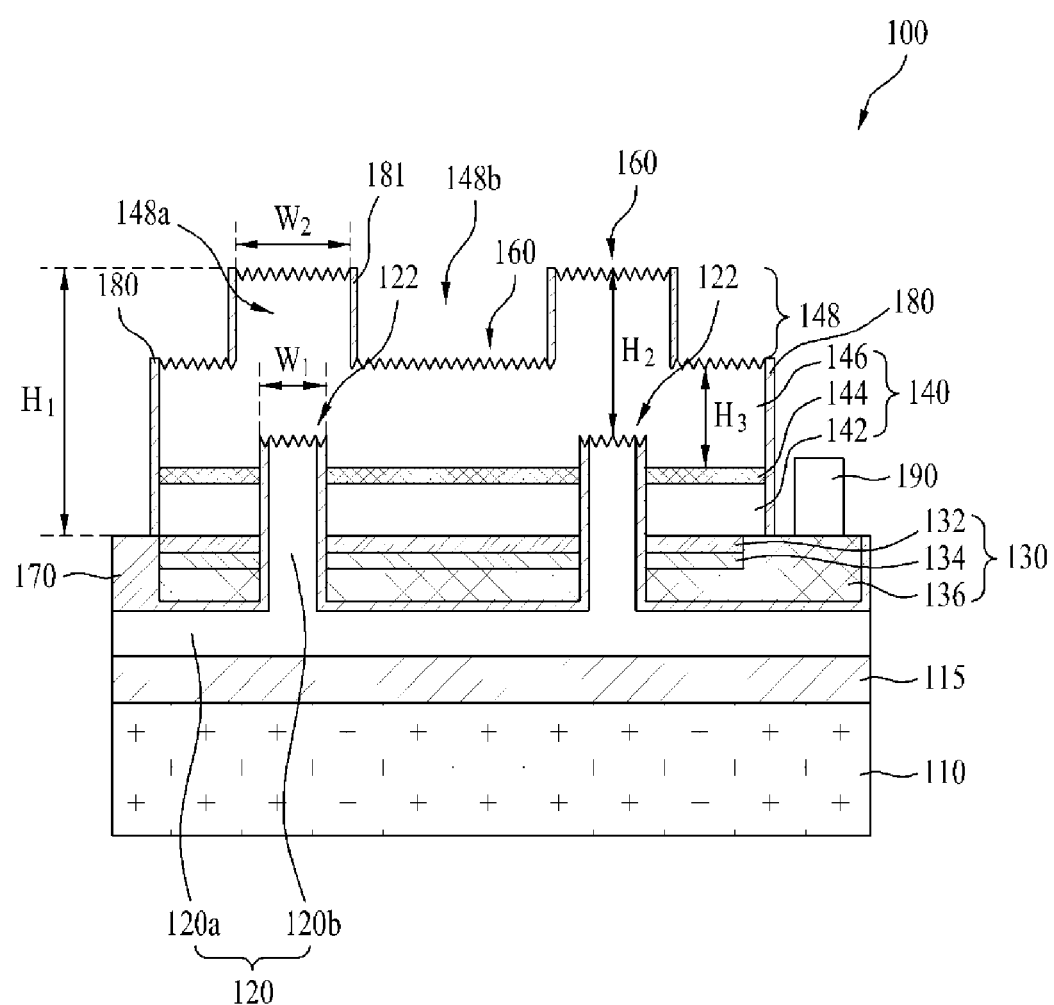
FIG. 1A is a sectional view illustrating a light emitting device according to an exemplary embodiment.
Figure 1B:
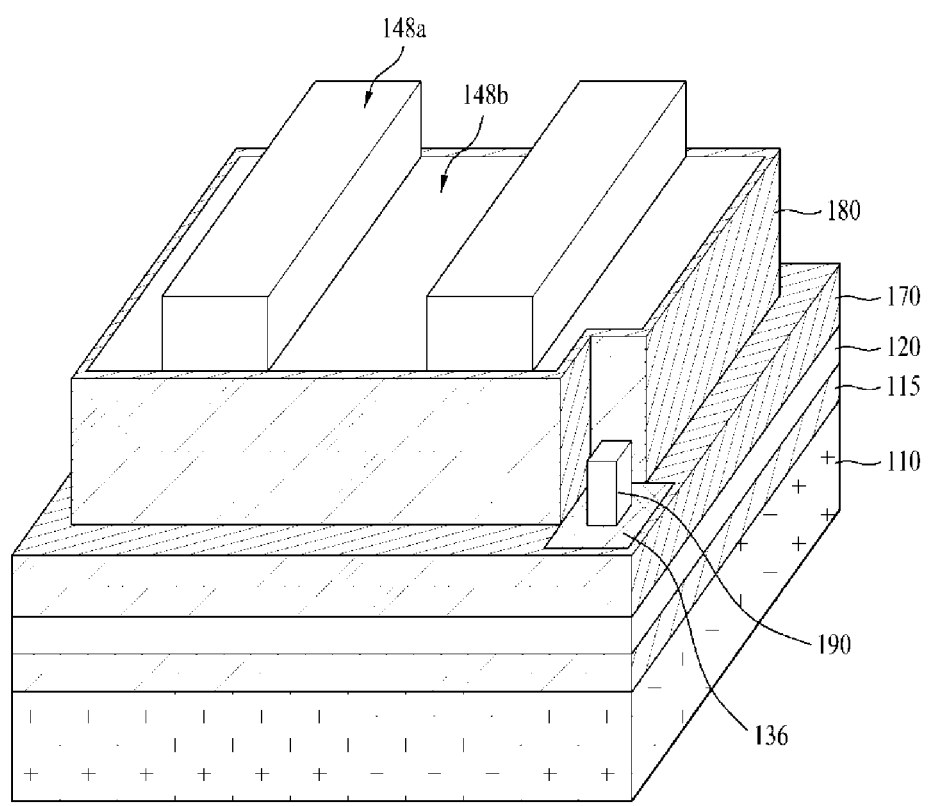
FIGS. 1B to 1G are perspective views illustrating light emitting devices according to various embodiments, respectively.
Figure 1C:
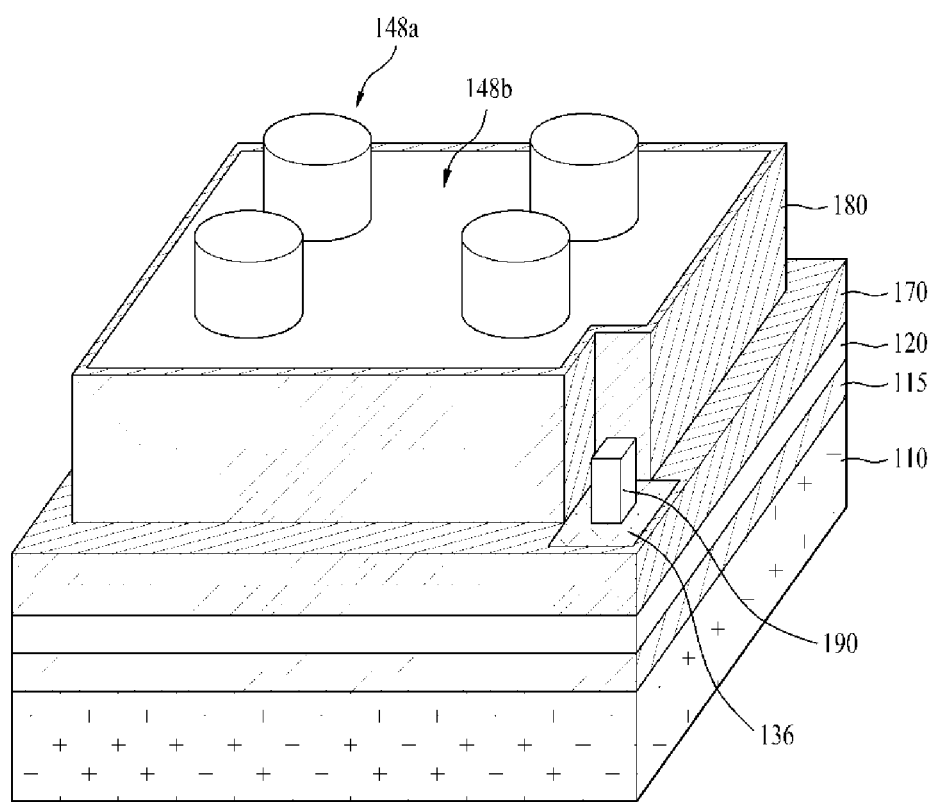
Figure 1D:
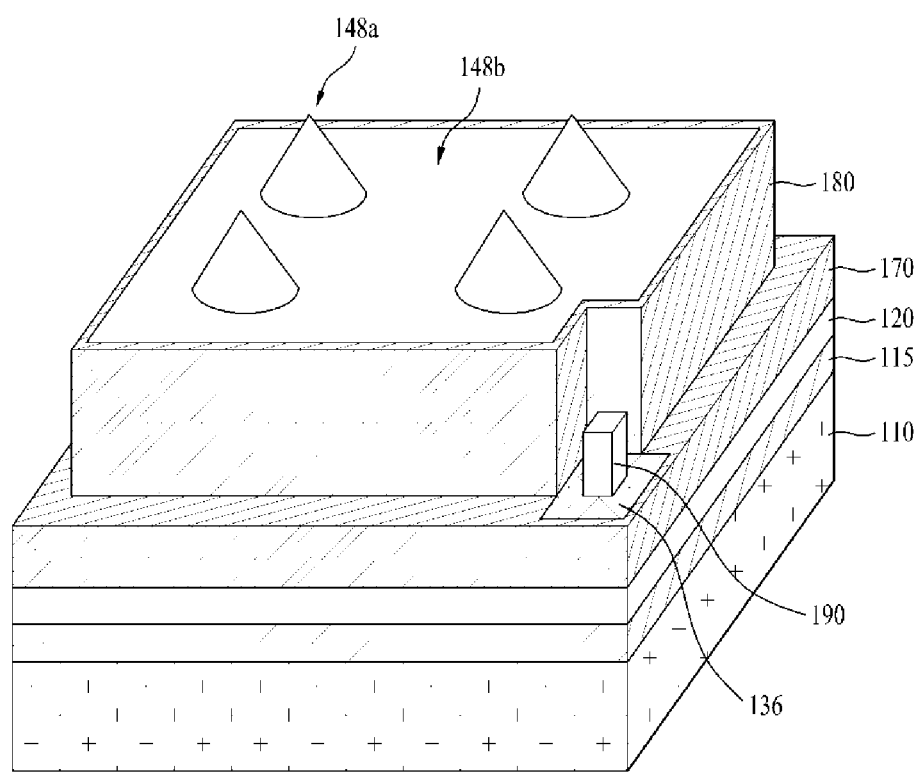
Figure 1E:
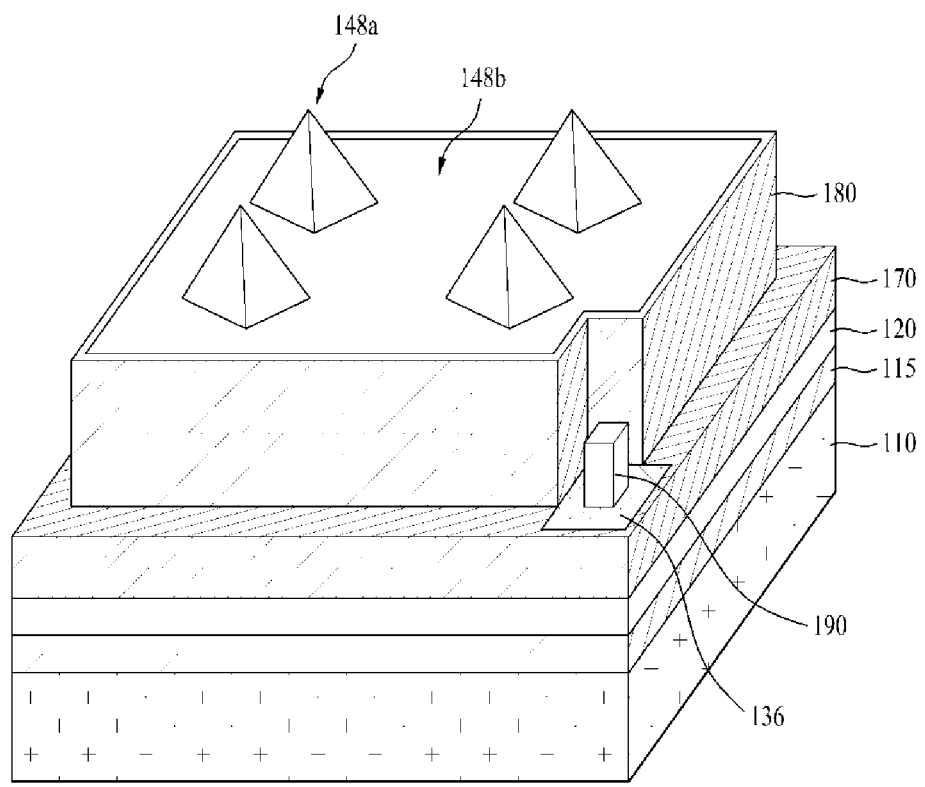
Figure 1F:
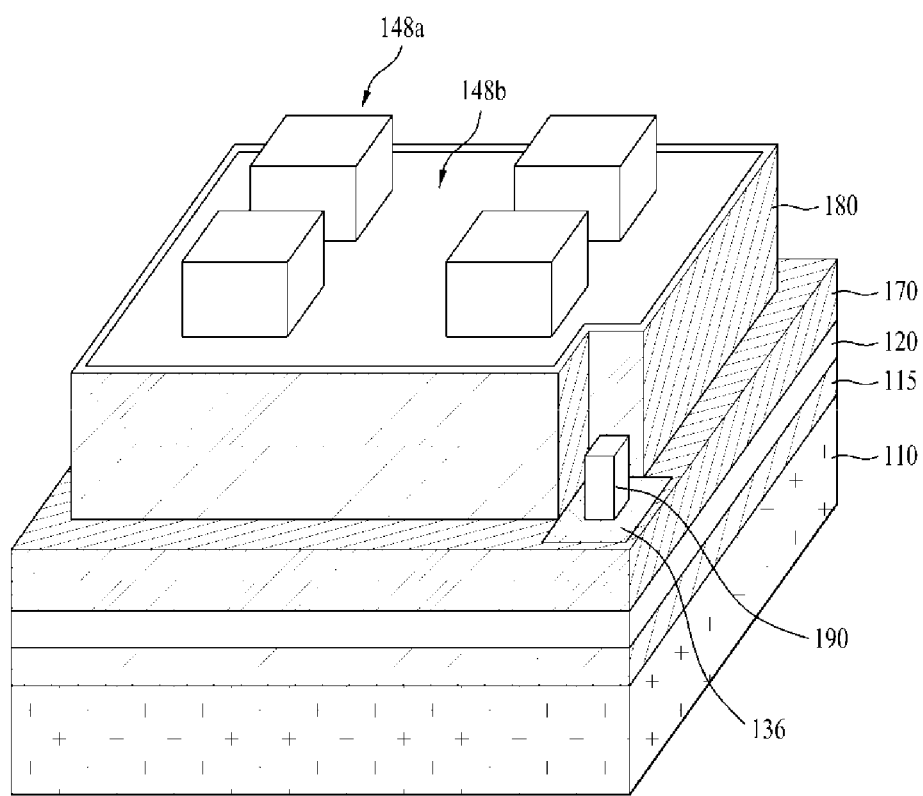
Figure 1G:
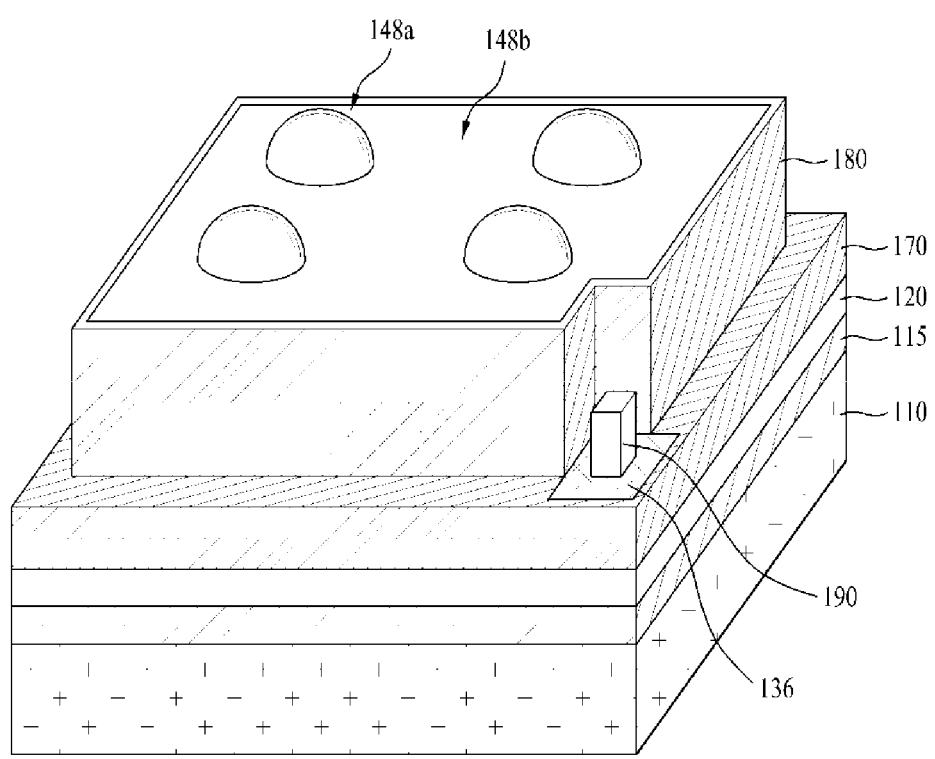

Hereinafter, embodiments will be described with reference to the annexed drawings.

It will be understood that when an element is referred to as being "on" or "under" another element, it can be directly on/under the element, and one or more intervening elements may also be present. When an element is referred to as being "on" or "under", "under the element" as well as "on the element" can be included based on the element.

In the drawings, the thickness or size of each layer is exaggerated, omitted, or schematically illustrated for convenience of description and clarity. Also, the size or area of each constituent element does not entirely reflect the actual size thereof.

FIG. 1A is a sectional view illustrating a light emitting device according to an exemplary embodiment. FIGS. 1B to 1G are perspective views illustrating light emitting devices according to various embodiments, respectively.

The light emitting device according to each of the illustrated embodiments, which is designated by reference numeral 100, includes a support substrate 110, a first electrode layer 120 disposed over the support substrate 110, a second electrode layer 130 disposed over the first electrode layer 120, and a light emitting structure 140 disposed over the second electrode layer 130. The light emitting structure 140 includes a first-conductivity-type semiconductor layer 146, an active layer 144, and a second-conductivity-type semiconductor layer 142, which are stacked in a same direction.

The light emitting device 100 may include a light emitting diode (LED) using a plurality of compound semiconductor layers, for example, semiconductor layers made of Group III-V elements. The LED may be a colored LED to emit blue, green, or red light, or an ultraviolet (UV) LED, although the present disclosure is not limited thereto. Emission of light from the LED may be achieved using various semiconductors, although the present disclosure is not limited thereto.

The light emitting structure 140 may be formed using, for example, metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), or the like. Of course, the formation method is not limited to the above-described methods.

The first-conductivity-type semiconductor layer 146 may be made of a semiconductor compound, for example, a Group III-V or Group II-VI compound semiconductor. The first-conductivity-type semiconductor layer 146 may be doped with a first-conductivity-type dopant. When the first-conductivity-type semiconductor layer 146 is an n-type semiconductor layer, the first-conductivity-type dopant is an n-type dopant. The n-type dopant may include Si, Ge, Sn, Se, or Te, although the present disclosure is not limited thereto. When the first-conductivity-type semiconductor layer 146 is a p-type semiconductor layer, the first-conductivity-type dopant is a p-type dopant. The p-type dopant may include Mg, Zn, Ca, Sr, Ba, or the like, although the present disclosure is not limited thereto.

The first-conductivity-type semiconductor layer 146 may include a semiconductor material having a formula of $Al_xIn_yGa_{1-x-y}N$ ($0 \le x \le 1$, $0 \le y \le 1$, and $0 \le x+y \le 1$). For example, the first-conductivity-type semiconductor layer 146 may be made of at least one of GaN, InN, AlN, InGaN, AlGaN, InAlGaN, AlInN, AlGaAs, InGaAs, AlInGaAs, GaP, AlGaP, InGaP, AlInGaP, and InP.

In order to achieve an enhancement in light extraction efficiency, a roughness or pattern 160 may be formed on an upper surface of the first-conductivity-type semiconductor layer 146.

In the active layer 144, electrons and holes meet, thereby emitting light with energy determined by the intrinsic energy band of the material of the active layer 144 (light emitting layer).

The active layer 144 may have at least one of a single quantum well structure, a multi quantum well structure, a quantum wire structure, and a quantum dot structure. For example, the active layer 144 may have a multi quantum well structure through injection of tri-methyl gallium gas (TMGa), ammonia gas ($NH_3$), nitrogen gas ($N_2$), and tri-methyl indium gas (TMIn), although the present disclosure is not limited thereto.

The active layer 144 may have well and barrier layers having a layer pair structure made of at least one of InGaN/GaN, InGaN/InGaN, GaN/AlGaN, InAlGaN/GaN, GaAs(InGaAs)/AlGaAs, and GaP(InGaP)/AlGaP, although the present disclosure is not limited thereto. The well layer may be made of a material having a narrower band gap than the barrier layer.

A conductive clad layer (not shown) may be formed over and/or beneath the active layer 144. The conductive clad layer may be made of a semiconductor having a wider bandgap than the barrier layer of the active layer 144. For example, the conductive clad layer may be made of GaN, AlGaN or InAlGaN, or may have a super-lattice structure. The conductive clad layer may be doped with a dopant to have an n-type or p-type conductivity.

The second-conductivity-type semiconductor layer 142 may be made of a semiconductor compound, for example, a Group III-V compound semiconductor doped with a second-conductivity-type dopant. For example, the second-conductivity-type semiconductor layer 142 may include a semiconductor material having a formula of $In_xAl_yGa_{1-x-y}N$ ($0<x\leq1$, $0\leq y\leq1$, $0\leq x+y\leq1$). When the second-conductivity-type semiconductor layer 142 is a p-type semiconductor layer, the second-conductivity-type dopant is a p-type dopant. The p-type dopant may include Mg, Zn, Ca, Sr, Ba, or the like, although the present disclosure is not limited thereto. When the second-conductivity-type semiconductor layer 142 is an n-type semiconductor layer, the second-conductivity-type dopant is an n-type dopant. The n-type dopant may include Si, Ge, Sn, Se, or Te, although the present disclosure is not limited thereto.

In the illustrated embodiments, the first semiconductor layer 146 may be implemented as an n-type semiconductor layer, and the second semiconductor layer 142 may be implemented as a p-type semiconductor layer. Alternatively, the first semiconductor layer 146 may be implemented as a p-type semiconductor layer, and the second semiconductor layer 142 may be implemented as an n-type semiconductor layer. Over the second-conduction-type semiconductor layer 142, a semiconductor layer having an opposite polarity to the second conduction type may be formed. For example, when the second-conduction-type semiconductor layer 142 is a p-type semiconductor layer, an n-type semiconductor layer (not shown) may be formed over the second-conduction-type semiconductor layer 142. Thus, the light emitting structure 140 may be implemented as one of an n-p junction structure, a p-n junction structure, an n-p-n junction structure, and a p-n-p junction structure.

The support substrate 110 supports the light emitting structure 140. The support substrate 110 may be a conductive substrate or an insulating substrate. Also, the support substrate 110 may be made of a material having high electrical conductivity and high thermal conductivity. For example, the support substrate 110 may be formed as a base substrate having a certain thickness, using a material selected from the group consisting of molybdenum (Mo), silicon (Si), tungsten (W), copper (Cu), aluminum (Al), and alloys thereof. Also, the support substrate 110 may selectively include gold (Au), a Cu alloy, Ni, Cu—W, a carrier wafer (for example, GaN, Si, Ge, GaAs, ZnO, SiGe, SiC, SiGe, $Ga_2O_3$, or the like), a conductive sheet, or the like.

The first electrode layer 120 is formed over the support substrate 110. The first electrode layer 120 may be made of a metal. The first electrode layer 120 may include at least one of an ohmic layer, a reflective layer, and a bonding layer. The first electrode layer 120 may come into ohmic contact with a first semiconductor layer 146, which will be described later, using a reflective metal or a conductive oxide.

The first electrode layer 120 may be made of Ag, Ni, Al, Rh, Pd, Ir, Ru, Mg, Zn, Pt, Au, Hf, or a selective combination thereof. The first electrode layer 120 may be formed to have a single layer structure or a multilayer structure, using a reflective electrode material having ohmic characteristics. When the first electrode layer 120 performs an ohmic function, the ohmic layer may be dispensed with.

The first electrode layer 120 may be made of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), $IrO_x$, $RuO_x$, NiO, $RuO_x$/ITO, Ni/$IrO_x$/Au, and Ni/$IrO_x$/Au/ITO, although the present disclosure is not limited thereto.

The first electrode layer 120 may include a bonding layer. In this case, the bonding layer may include a barrier metal or a bonding metal. For example, the bonding layer may include at least one of Ti, Au, Sn, Ni, Cr, Ga, In, Bi, Cu, Ag, and Ta.

When the first electrode layer 120 does not include a bonding layer, a separate bonding layer 115 may be formed to achieve bonding to the support substrate 110, as shown in FIG. 1. The bonding layer 115 may be made of a material selected from the group consisting of Au, Sn, In, Ag, Ni, Nb, Cu, and alloys thereof, although the present disclosure is not limited thereto.

The second electrode layer 130 is formed on a main electrode 120a of the first electrode layer 120, which will be described later. An insulating layer 170 is disposed between the second electrode 130 and the first electrode layer 120, to electrically insulate the first and second electrode layers 120 and 130.

The second electrode layer 130 may have a structure of ohmic layer/reflective layer/bonding layer, a structure of ohmic layer/reflective layer, or a structure of reflective layer (including ohmic characteristics)/bonding layer, although the present disclosure is not limited thereto. Also, the second electrode layer 130 may include a current spreading layer. For example, the second electrode layer 130 may have a structure in which a current spreading layer 136, a reflective layer 134, and an ohmic layer 132 are sequentially stacked over the insulating layer 170.

The current spreading layer 136 may be made of a metal having high electrical conductivity. The current spreading layer 136 is electrically connected to an electrode pad 190, which will be described later, to supply current to the second-conductivity-type semiconductor layer 142. The current spreading layer 136 may be made of, for example, at least one selected from the group consisting of Ti, Au, Ni, In, Co, W, and Fe, although the present disclosure is not limited thereto.

The reflective layer 134 is disposed over the current spreading layer 136. The reflective layer 134 may be made of a reflection material having reflectance of 50% or more. The reflective layer 134 may be made of, for example, a selective combination of Ag, Ni, Al, Rh, Pd, Ir, Ru, Mg, Zn, Pt, Au, and Hf. Alternatively, the reflective layer 134 may be formed to have a multilayer structure, using the metal materials and a light-transmitting conductive material such as IZO, IZTO, IAZO, IGZO, IGTO, AZO, and ATO. The reflective layer 134 may have a lamination structure of IZO/Ni, AZO/Ag, IZO/Ag/Ni, AZO/Ag/Ni, or the like. When the reflective layer 134 is made of a material coming into ohmic contact with the light emitting structure 140 (for example, the second-conductivity-type semiconductor layer 142), the ohmic layer 132 may be dispensed with, although the present disclosure is not limited thereto.

The ohmic layer 132 may be disposed to contact the second-conductivity-type semiconductor layer 142. When the second-conductivity-type semiconductor layer 142 is a p-type semiconductor layer, the second-conductivity-type semiconductor layer 142 has high contact resistance due to a low dopant concentration thereof. For this reason, the second-conductivity-type semiconductor layer 142 may exhibit poor metal ohmic characteristics. The ohmic layer 132 is adapted to improve the ohmic characteristics. The ohmic layer 132 is not a necessity.

Since the ohmic layer 132 is interposed between the light emitting structure 140 and the reflective layer 134, it may be formed using a transparent electrode or the like. Also, the ohmic layer 132 may have a multilayer structure or a plurality of patterns.

The ohmic layer 132 may have a thickness of about 200 Å. For the ohmic layer 132, a light-transmitting conductive layer or a metal may be selectively used. For example, the ohmic layer 132 may be made of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—GaZnO (AGZO), In—GaZnO (IGZO), ZnO, $IrO_x$, $RuO_x$, NiO, $RuO_x$/ITO, $Ni/IrO_x/Au$, $Ni/IrO_x/Au/ITO$, Ag, Ni, Cr, Ti, Al, Rh, Pd, Ir, Sn, In, Ru, Mg, Zn, Pt, Au, and Hf, although the present disclosure is not limited thereto.

The first electrode layer 120 includes the main electrode 120a, and at least one contact electrode 120b, which branches from the main electrode 120a, and contacts the first-conductivity-type semiconductor layer 146 after extending through the second electrode layer 130, second-conductivity-type semiconductor layer 142, and active layer 144.

A plurality of contact layers 120b may branch from the main electrode 120a of the first electrode layer 120 while being spaced apart from one another. When the first electrode layer 120 includes a plurality of contact electrodes 120b, it may be possible to smoothly supply current to the first-conductivity-type semiconductor layer 146. The contact electrodes 120b may have at least one of patterns having various shapes when viewed from the top side, that is, a radial pattern, a cross pattern, a line pattern, a curve pattern, a loop pattern, a link pattern, and a ring pattern, although the present disclosure is not limited thereto.

Meanwhile, an ohmic layer may be formed on the contact layer 120b, to allow the contact electrode 120b to come into ohmic contact with the first-conductivity-type semiconductor layer 146.

A roughness 122 may be formed at a portion of the contact electrode 120b contacting the first-conductivity-type semiconductor layer 146. The roughness 122 is a random pattern of irregularities formed at a portion of the contact electrode 120b contacting the first-conductivity-type semiconductor layer 146. The roughness 122 may be formed using a wet etching process or a dry etching process.

The roughness 122 increase the contact area between the first electrode layer 120 and the first-conductivity-type semiconductor layer 146. As the contact area between the first electrode layer 120 and the first-conductivity-type semiconductor layer 146 increases, the electrode contact area is increased, thereby achieving an improvement in the electrical characteristics of the light emitting device 100. In addition, the bonding force between the first electrode layer 120 and the first-conductivity-type semiconductor layer 146 is increased, thereby achieving an enhancement in the reliability of the light emitting device 100.

The insulating layer is formed between the first electrode layer 120 and the second electrode layer 130 and on the side walls of the first electrode layer 120 and contact electrode 120b, to insulate the first electrode layer 120 from other layers, for example, the layers 130, 142, and 144, and thus to avoid electrical short circuit.

The insulating layer 170 may be made of a non-conductive oxide or nitride. For example, the insulating layer 170 may be comprised of at least one of a silicon oxide ($SiO_2$) layer, an oxide nitride layer, and an aluminum oxide layer.

A portion of the second electrode layer 130, for example, a portion of the current spreading layer 136 of the second electrode layer 130 in the embodiment of FIG. 1, may be exposed outside the light emitting structure 140. The electrode pad 190 may be formed on the exposed portion of the second electrode layer 130.

The electrode pad 190 may be made of at least one of aluminum (Al), titanium (Ti), chromium (Cr), nickel (Ni), copper (Cu), and gold (Au), to have a single layer structure or a multilayer structure.

A passivation layer 180 may be formed on side surfaces of the light emitting structure 140. For example, the passivation layer 180 may be disposed to cover portions of the second-conductivity-type semiconductor layer 142, active layer 144, and first-conductivity-type semiconductor layer 146.

Another passivation layer 181 may be formed on side surfaces of convex portions 148a of a concave/convex structure 148 included in the first-conductivity-type semiconductor layer 146, which will be described later.

The passivation layer 180 is made of an insulating material, to avoid electrical short circuit between the light emitting structure 140 and the electrode pad 190. The passivation layer 180 may be made of the same material as the insulating layer 170.

The concave/convex structure 148 of the first-conductivity-type semiconductor layer 146 includes, in addition to the convex portions 148a, a concave portion 148b having a lower height than the convex portions 148a. The convex portions 148a may overlap with the contact electrodes 120b of the first electrode layer 120.

That is, the convex portions 148a may overlap with the contact electrodes 120b of the first electrode layer 120 in a lamination direction of the light emitting structure 140.

Referring to FIGS. 1B to 1G, the convex portions 140a may have at least one of a stripe shape, a square prism shape, a circular prism shape, a conical shape, a pyramid shape, and a hemi-spherical shape, although the present disclosure is not limited thereto.

Although a roughness or pattern 160 is formed on the first-conductivity-type semiconductor layer 146, it is not shown in FIGS. 1B to 1G, for convenience of illustration.

Conventional light emitting devices are thick because the first-conductivity-type semiconductor layer thereof is thickly formed to secure a region corresponding to the height of the contact electrode of the first electrode layer.

If the first-conductivity-type semiconductor layer 146, which is an upper layer of the light emitting structure 140, is thick, the length of the path, along which light generated from the active layer 144 travels before being outwardly emitted, is long, so that a part of the light may be absorbed in the first-conductivity-type semiconductor layer 146. As a result, the light extraction efficiency of the light emitting device may be degraded.

In the illustrated embodiments, the first-conductivity-type semiconductor layer 146 has the concave/convex structure 148. Each convex portion 148a of the concave/convex structure 148 has a predetermined height difference $H_2$ from the upper surface of the corresponding contact electrode 120b, to secure reliability of the light emitting device. At a portion of the first-conductivity-type semiconductor layer 146 where the contact electrodes 120b are not present, the concave portion 148b of the concave/convex structure 148 is formed to reduce the height of the first-conductivity-type semiconductor layer 146 to a height $H_3$. Thus, the light extraction efficiency of the light emitting device 100 may be enhanced.

That is, the concave portion 148b has a smaller thickness than the convex portions 148a.

The predetermined height difference $H_2$ should be kept between the upper surface of the first-conductivity-type semiconductor layer 146 and the upper surface of each contact electrode 120b. If the contact electrode 120b is too close to the upper surface of the first-conductivity-type semiconductor layer 146, a portion of the contact electrode 120b may be outwardly exposed in a texturing process to form a roughness or pattern on the surface of the first-conductivity-type semiconductor layer 146, so that electrical short circuit may occur. The height difference $H_2$ may be 1 to 5 μm, to avoid interference with light extraction while securing reliability of the light emitting device.

Also, the height difference $H_3$ between the concave portion 148b of the concave/convex structure 148 in the first-conductivity-type semiconductor layer 146 and the active layer 144 of the light emitting structure 140 should be kept at a predetermined degree. If the active layer 142 is too close to the upper surface of the first-conductivity-type semiconductor layer 146, a portion of the active layer 144 may be outwardly exposed in the texturing process to form a roughness or pattern on the surface of the first-conductivity-type semiconductor layer 146, so that reliability of the light emitting device may be degraded. The height difference $H_3$ may be 0.5 to 4 μm, to avoid interference with light extraction while securing reliability of the light emitting device.

The total height $H_1$ of the light emitting structure 140 may be 1 to 5 μm.

Each convex portion 148a of the concave/convex structure 148 may vertically overlap with the corresponding contact electrode 120b of the first electrode layer 120. The convex portion 148 may also have a width $W_2$ equal to or greater than a width $W_1$ of the contact electrode 120b.

The width $W_2$ of each convex portion 148a may depend on the width of the spacing between the contact electrodes 120b branching from the main electrode 120a of the first electrode layer 120. In an exemplary embodiment, the width $W_3$ of the convex portions 148a may be 1 to 5 times the width W1 of the contact electrodes 120b.

In accordance with the illustrated embodiments, it may be possible to secure reliability of the light emitting device because each convex portion 148a of the first-conductivity-type semiconductor layer 146 maintains the predetermined height difference $H_2$ from the corresponding contact electrode 120b while vertically overlapping with the contact electrode 120b. Also, it may be possible to enhance the light extraction efficiency of the light emitting device because the concave portion 148b is formed at the portion of the first-conductivity-type semiconductor layer 146 where the contact electrodes 120b are not disposed, to reduce the thickness of the first-conductivity-type semiconductor layer 146.

The concave/convex structure 148 of the first-conductivity-type semiconductor layer 146 may be formed by forming a photoresist (PR) layer over the upper surface of the first-conductivity-type semiconductor layer 146, covering a mask with a pattern on the PR layer, and irradiating ultraviolet (UV) light to the resulting structure.

For the PR layer, a positive PR film, in which a light-irradiated portion thereof is etched during development, or a negative PR film, in which a light-irradiated portion thereof is left after development, may be used.

Since light generated from the active layer 144 is emitted not only from the upper surface of the first-conductivity-type semiconductor layer 146, but also from the side surfaces of the convex portions 148a, the concave/convex structure 148 formed at the first-conductivity-type semiconductor layer 146 increases the light emission area. Thus, the luminous characteristics of the light emitting device may be improved.

FIGS. 2 to 10 are views illustrating a light emitting device manufacturing method according to an exemplary embodiment. Hereinafter, the light emitting device manufacturing method will be described with reference to FIGS. 2 to 10.

Figure 2:
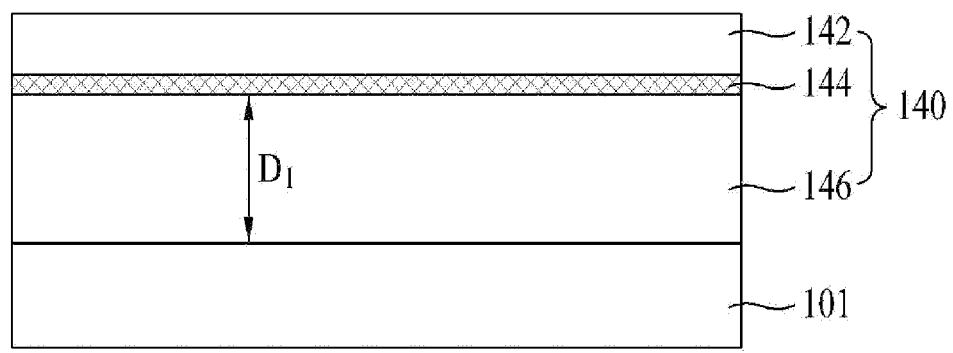
FIGS. 2 to 10 are views illustrating a light emitting device manufacturing method according to an exemplary embodiment.

Referring to FIG. 2, the light emitting structure 140 is grown over a substrate 101.

The substrate 101 may be formed using a material suitable for growth of a semiconductor material or a carrier wafer. The substrate 101 may also be made of a material having excellent thermal conductivity. The substrate 101 may be a conductive substrate or an insulating substrate. For example, the substrate 101 may be made of at least one of sapphire ($Al_2O_3$), SiC, GaAs, GaN, ZnO, Si, GaP, InP, Ge, and $Ga_2O_3$. An irregularity structure may be formed on the substrate 101, although the present disclosure is not limited thereto. Wet washing may be performed upon the substrate 101, to remove impurities from the surface of the substrate 101.

The light emitting structure 140 may be formed by sequentially forming, over the substrate 101, the first-conductivity-type semiconductor layer 146, active layer 144, and second-conductivity-type semiconductor layer 142.

The light emitting structure 140 may be formed using, for example, metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), or the like. Of course, the formation method is not limited to the above-described methods.

The first-conductivity-type semiconductor layer 146 is grown to a thickness D1, which is greater than the thickness of the first-conductivity-type semiconductor layer formed in a general light emitting device having no contact electrode.

A buffer layer (not shown) may be grown between the light emitting structure 140 and the substrate 101. The buffer layer is adapted to reduce lattice mismatch and coefficient of thermal expansion differences between the material of the substrate 101 and the material of the layer formed over the substrate 101. The buffer layer may be made of a Group III-V compound semiconductor, for example, at least one of GaN, InN, AlN, InGaN, AlGaN, InAlGaN, and AlInN. An undoped semiconductor layer may be formed over the buffer layer, although the present disclosure is not limited thereto.

Figure 3:
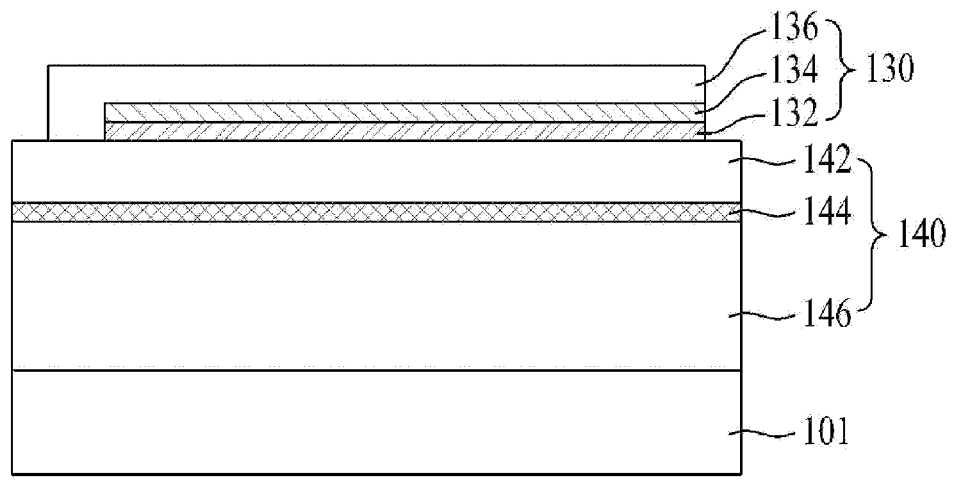

Referring to FIG. 3, the second electrode layer 130 is then formed on the second-conductivity-type semiconductor layer 142. The second electrode layer 130 may have a structure of ohmic layer/reflective layer/bonding layer, a structure of ohmic layer/reflective layer, or a structure of reflective layer/bonding layer. Also, the second electrode layer 130 may include a current spreading layer.

For example, the ohmic layer 132 and reflective layer 134 may be formed on the second-conductivity-type semiconductor layer 142, and the current spreading layer 136 may be formed over the reflective layer 134. In this case, the current spreading layer 136 may be grown to have a greater width than the ohmic layer 132 and reflective layer 134. The current spreading layer 136 may be in contact with the second-conductivity-type semiconductor layer 142, to subsequently supply current to the second-conductivity-type semiconductor layer 142.

The ohmic layer 132, reflective layer 134, and current spreading layer 136 may be formed using, for example, one of electron bean deposition, sputtering, and plasma enhanced chemical vapor deposition (PECVD), although the present disclosure is not limited thereto.

The structure of FIG. 3 is only one example. The area where the ohmic layer 132, reflective layer 134, and current spreading layer 136 are formed may be diversely selected.

Figure 4:
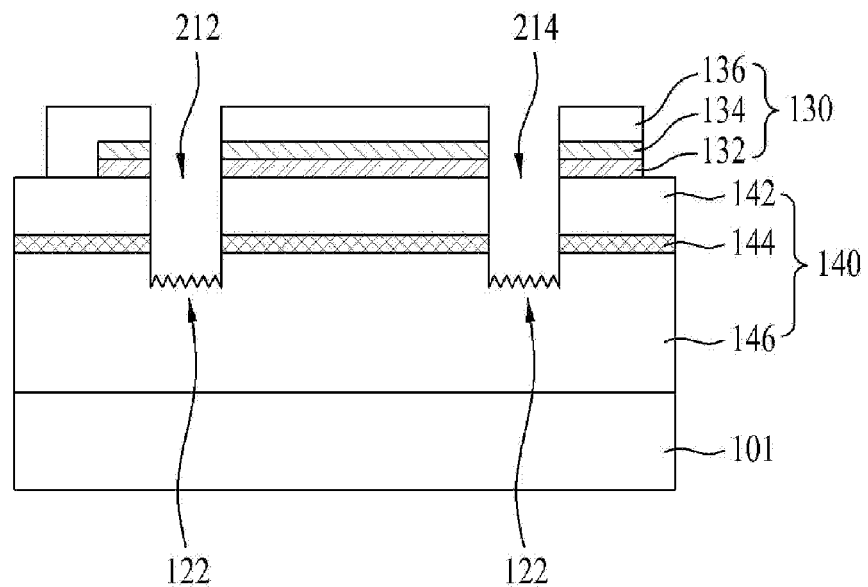

Referring to FIG. 4, at least one via hole may be formed to extend through the second electrode layer 130, second-conductivity-type semiconductor layer 142, and active layer 144 in order to expose the first-conductivity-type semiconductor layer 146. In the illustrated embodiment, two via holes 212 and 214 are formed. A roughness 122 may be formed at a bottom of each of the via holes 212 and 214.

The via holes 212 and 214 are formed using, for example, a photolithography process and an etching process. The via holes 212 and 214 may be formed by selectively etching the second electrode layer 130 such that the second-conductivity-type semiconductor layer 142 is exposed, and then etching the exposed second-conductivity-type semiconductor layer 142 and the active layer 144 disposed therebeneath such that the first-conductivity-type semiconductor layer 146 is exposed.

The roughness 122 may be formed by subjecting the first-conductivity-type semiconductor layer 146 exposed through the via holes 212 and 214 to a dry etching process or a photo electro-chemical (PEC) etching process.

Figure 5:
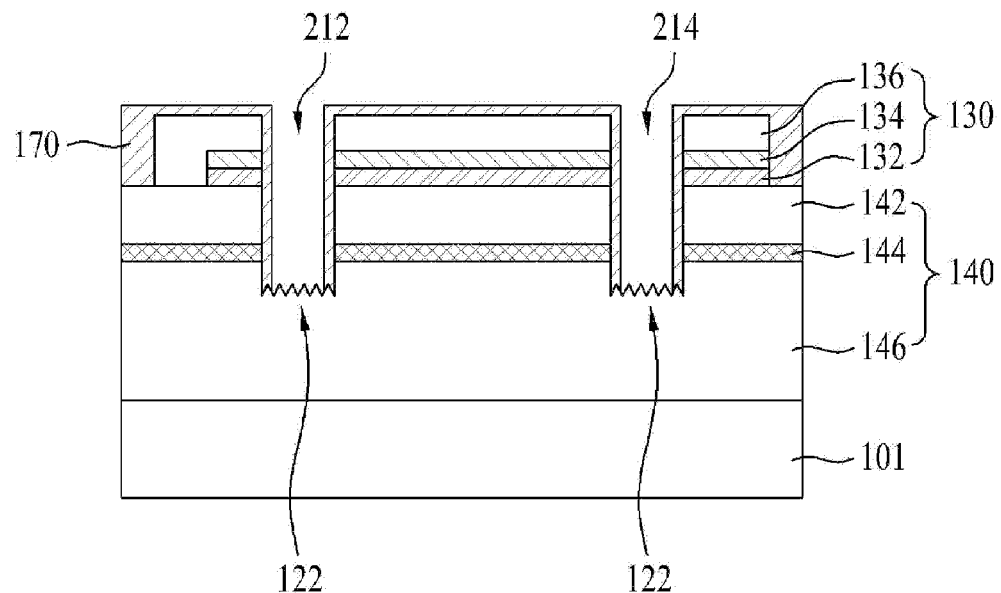

Thereafter, the insulating layer 170 is formed on the upper surface of the second electrode layer 130 and side surfaces of the via holes 212 and 214, as shown in FIG. 5.

Figure 6:
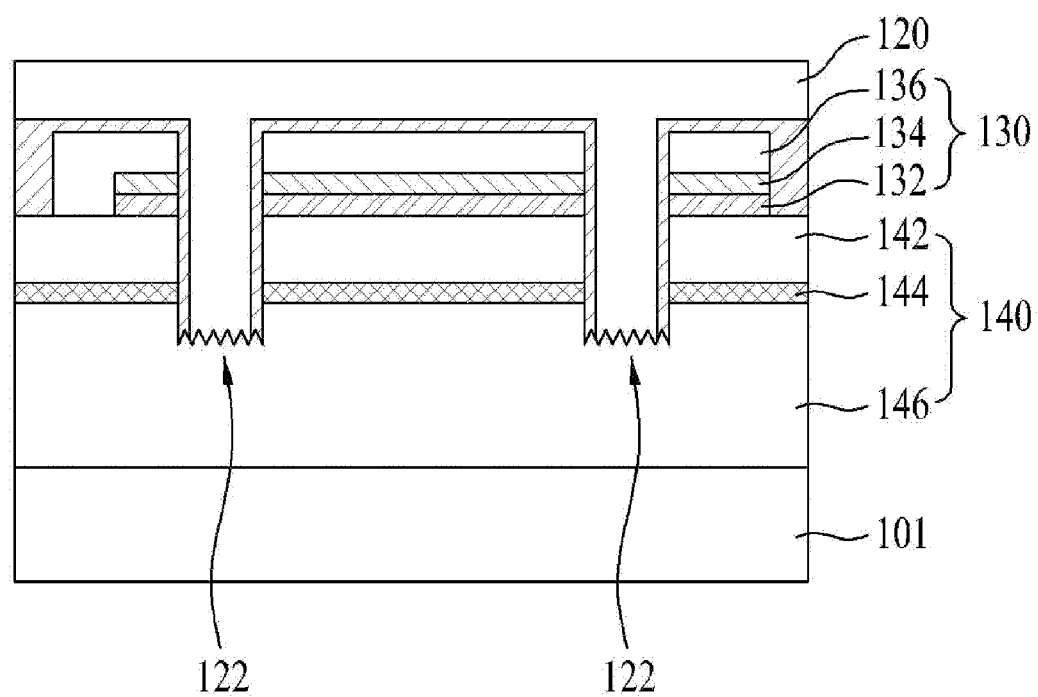

Subsequently, as shown in FIG. 6, the via holes 212 and 214 are filled with a conductive material, to form the first electrode layer 120, which contacts the first-conductivity-type semiconductor layer 146. In this case, the conductive material also covers a roughness 116 formed at the bottom surface of each of the via holes 212 and 214.

The conductive material may be a metal exhibiting high electrical conductivity. The conductive material may be at least one of aluminum (Al), titanium (Ti), chromium (Cr), nickel (Ni), copper (Cu), and gold (Au), to have a single layer structure or a multilayer structure, although the present disclosure is not limited thereto.

The conductive material filling the via holes 212 and 214 forms the contact electrodes 120b of the first electrode layer 120.

Figure 7:
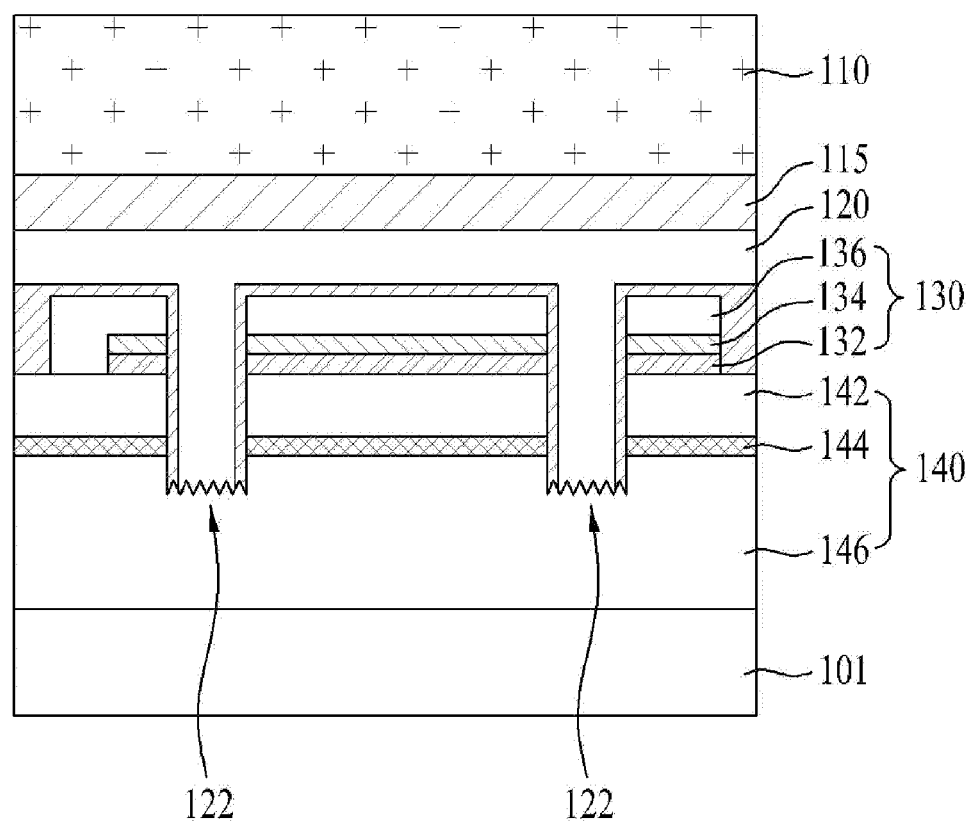

Thereafter, the support substrate 110 is disposed on the first electrode layer 120, as shown in FIG. 7. The support substrate 110 may be attached to the first electrode layer 120, using a bonding method, or may be formed over the first electrode layer 120, using a plating method or a deposition method. When the support substrate 110 is attached to the first electrode layer 120, using a bonding method, the attachment may be achieved using a separate bonding layer 115.

Figure 8:
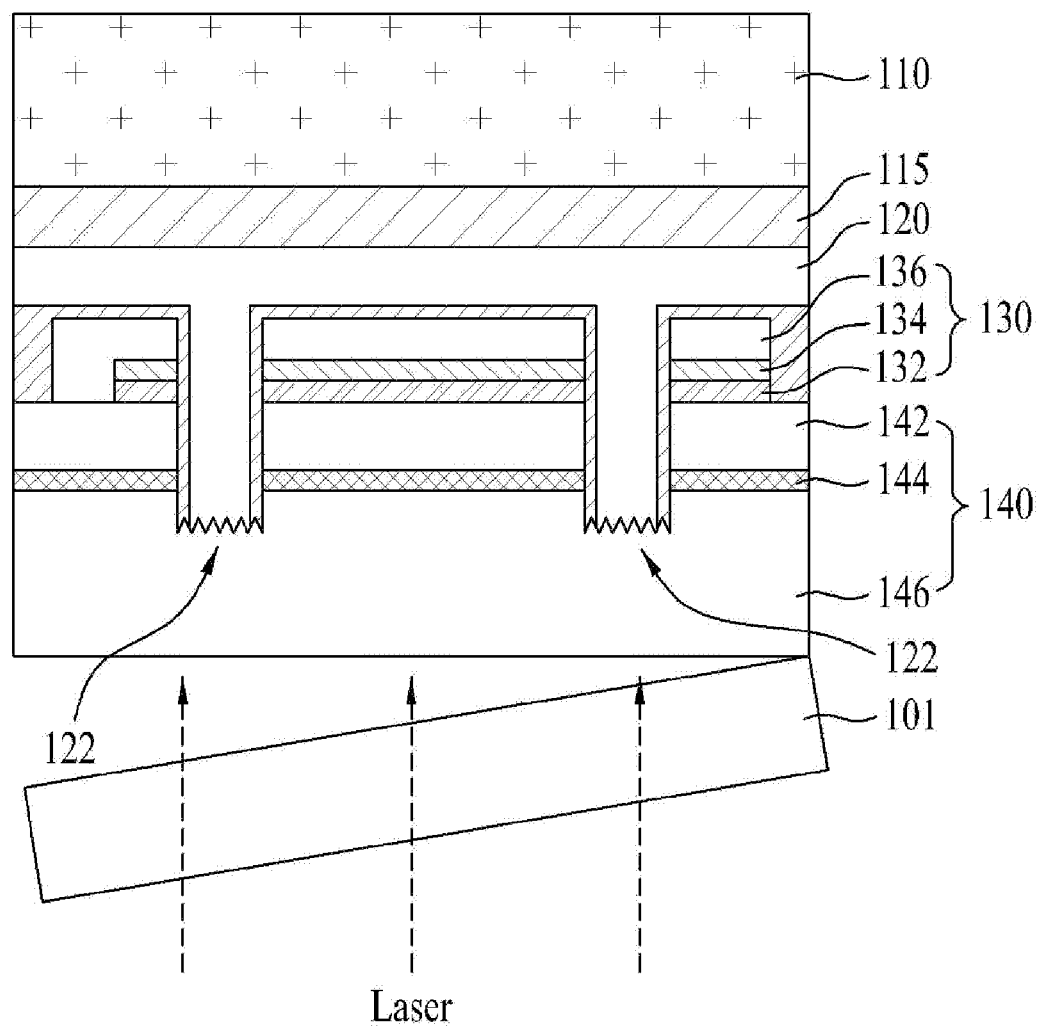

The substrate 101 is then separated, as shown in FIG. 8. Separation of the substrate 110 may be achieved through a laser lift-off (LLO) method using an excimer laser, or a dry or wet etching method.

Hereinafter, separation of the substrate 191 through the LLO method will be described in brief. When an excimer laser of a predetermined wavelength range is irradiated toward the substrate 101 in a focused state, thermal energy is concentrated on an interface between the substrate 101 and the light emitting structure 140, so that the interface is split into gallium and nitrogen molecules. As a result, instantaneous separation of the substrate 101 occurs in a region upon which the laser is incident.

Figure 9:
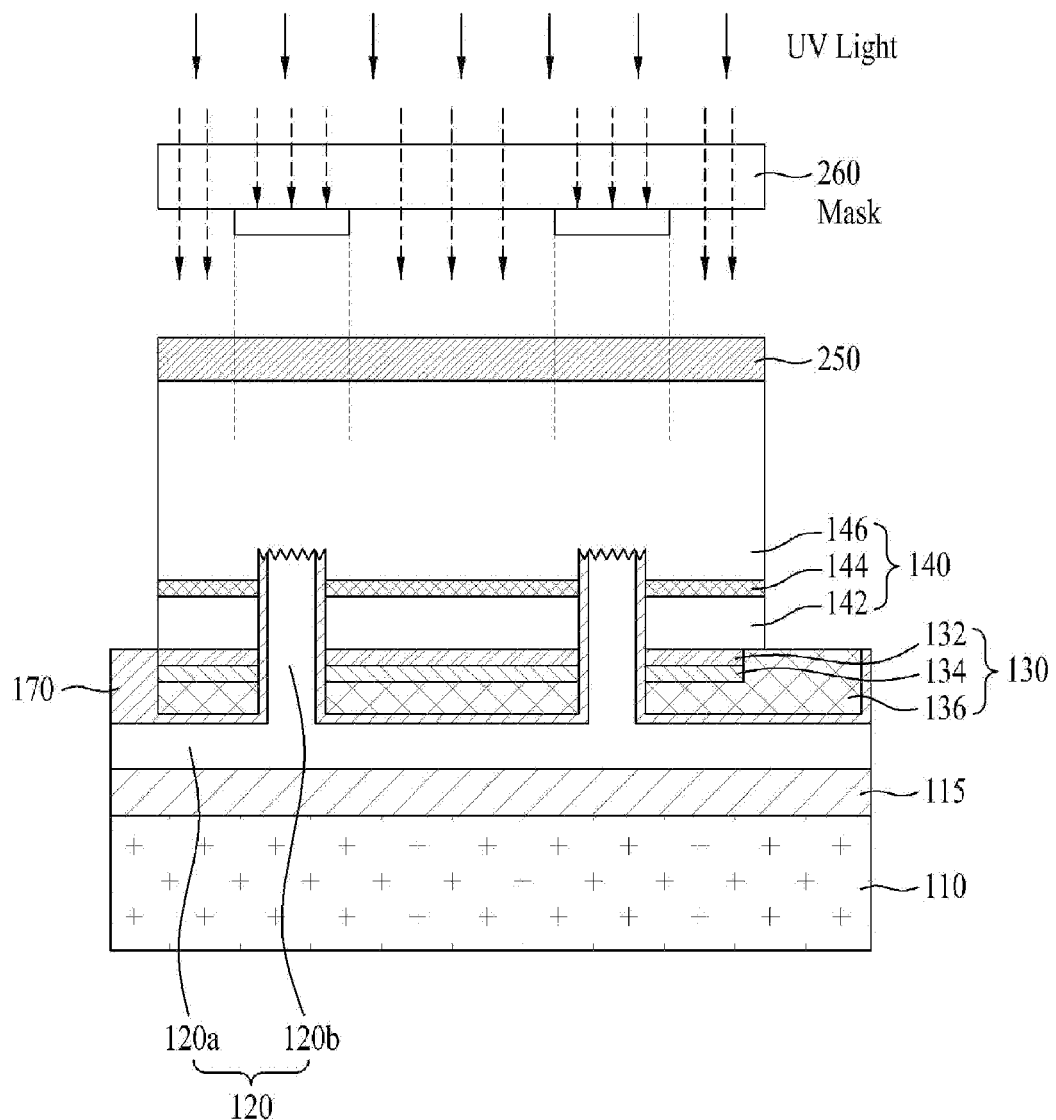

Subsequently, as shown in FIG. 9, the light emitting structure 140 is subjected to isolation etching so as to divide the same into portions each corresponding to a unit light emitting device. The isolation etching may be achieved through, for example, a dry etching method using inductively coupled plasma (ICP). In accordance with the isolation etching, a portion of the second electrode layer 130 in each unit light emitting device may be outwardly exposed. For example, as the light emitting structure 140 is etched in accordance with the isolating etching, one side portion of the second electrode layer 130 in each unit light emitting device, namely, an edge portion of the second electrode layer 130, may be outwardly exposed.

Thereafter, a photoresist (PR) layer 250 is formed over the first-conductivity-type semiconductor layer 146. The PR layer 250 may be formed using a positive PR film, in which a light-irradiated portion thereof is etched during development, or a negative PR film, in which a light-irradiated portion thereof remains left after development. In the embodiment of FIG. 9, a positive PR film is used.

Figure 10:
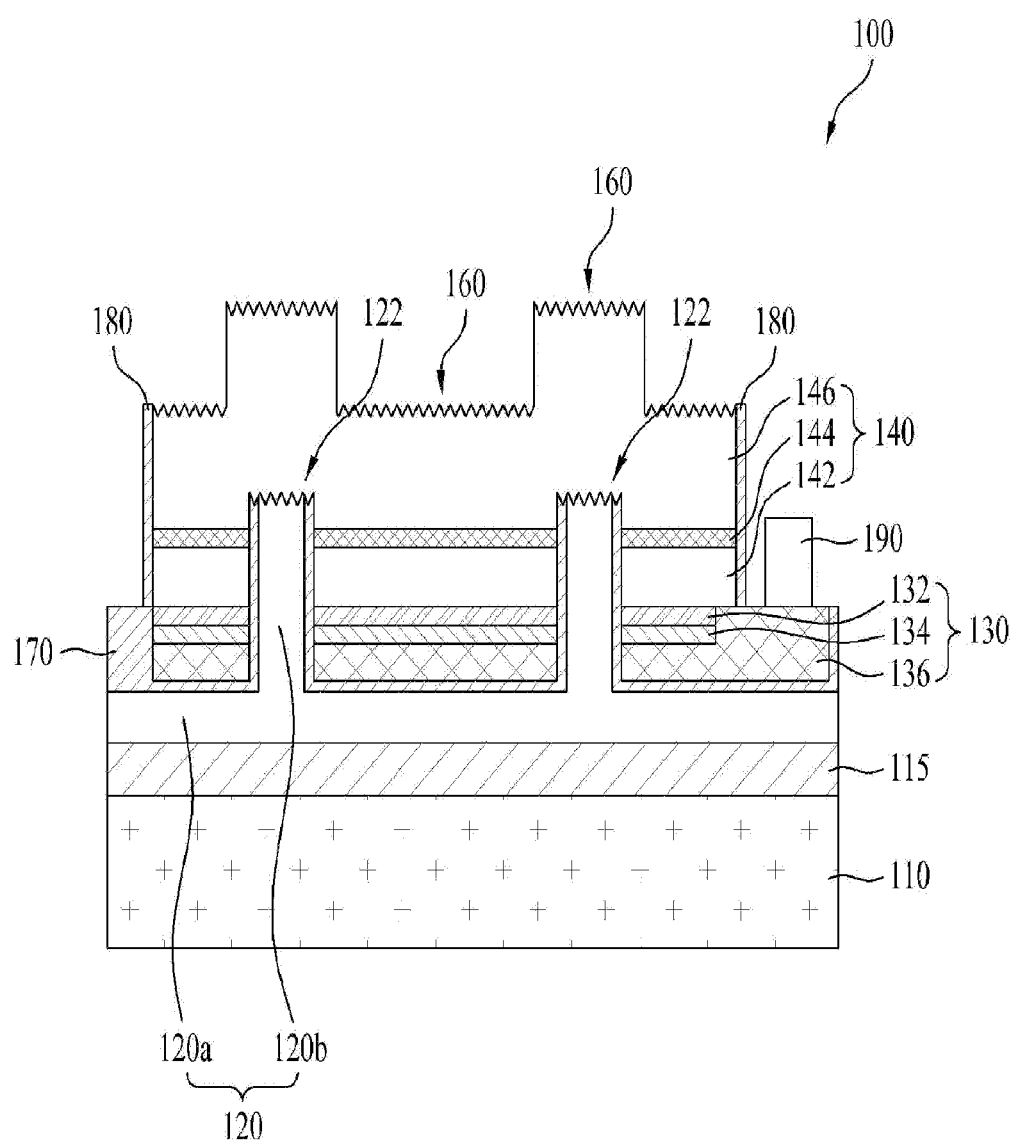

After formation of the PR layer 250, a mask 260 formed with a pattern covers the PR layer 250. When ultraviolet (UV) light is irradiated to the resulting structure, the pattern formed at the mask 260 is developed on the PR layer 250. As a result, a portion of the PR layer 250, to which UV light is irradiated through the mask 260, is etched. In accordance with subsequent etching, the concave/convex structure 148 is formed on the first-conductivity-type semiconductor layer 146, as shown in FIG. 10.

As described above, the convex portions 148a of the concave/convex structure 148 overlap with the contact electrodes 120b, respectively.

Although the concave/convex structure 148 is formed after isolation etching in the illustrated embodiment, there is no limitation as to the order of the processes.

The electrode pad 190 is then formed on the portion of the second electrode layer 130 exposed in accordance with the isolation etching process.

Subsequently, the passivation layer 180 is formed to cover side surfaces of the light emitting structure 140 in each light emitting device.

Although the passivation layer 180 is formed to cover the side surfaces of the light emitting structure 140, the present disclosure is not limited thereto. For example, the passivation layer 180 may be formed to cover the side surfaces of the light emitting structure 140 and a portion of the upper surface of the light emitting structure 140. The passivation layer 181 may also be formed on side surfaces of each convex portion 148a of the first-conductivity-type semiconductor layer 146.

The roughness or pattern 160 is then formed on the first-conductivity-type semiconductor layer 146.

Figure 11:
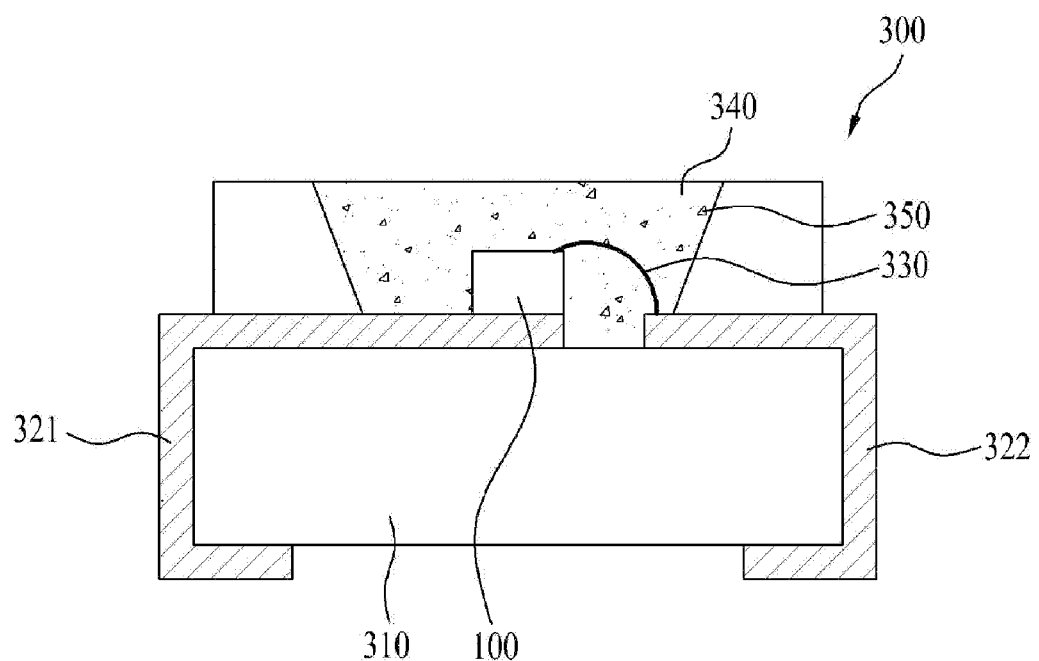
FIG. 11 is a sectional view illustrating a light emitting device package according to an exemplary embodiment.

FIG. 11 is a sectional view illustrating a light emitting device package according to an exemplary embodiment.

The light emitting device package according to the illustrated embodiment, which is designated by reference numeral "300", includes a body 310, first and second lead frames 321 and 322 mounted on the body 310, the light emitting device 100 according to one the above-described embodiment, which is mounted on the body 300, to be electrically connected to the first and second lead frames 321 and 322, and a mold 340 encompassing the light emitting device 100.

The body 310 may be made of a silicon material, a synthetic resin material, or a metal material. When the body 310 is made of a conductive material such as a metal material, an insulating layer is coated over the surface of the body 310, although not shown, in order to avoid electrical short circuit between the first and second lead frames 321 and 322.

The first and second lead frames 321 and 322 are electrically isolated from each other, and supply current to the light emitting device 100. The first and second lead frames 321 and 322 may also reflect light generated from the light emitting device 100 so as to achieve an enhancement in luminous efficacy. In addition, the first and second lead frames 321 and 322 may function to outwardly dissipate heat generated from the light emitting device 100.

The light emitting device 100 may be mounted on the body 310 or on the first lead frame 321 or second lead frame 322. In the illustrated embodiment, the light emitting device 100 is directly electrically connected to the first lead frame 321 while being connected to the second lead frame 322 via a wire 330. The light emitting device 100 may be connected to the lead frames 321 and 322, using a flip-chip method or a die-bonding method, in place of the wire-bonding method.

The mold 340 encapsulates the light emitting device 100, to protect the light emitting device 100. The mold 340 includes phosphors 350, to change the wavelength of light emitted from the light emitting device 100.

The phosphors 350 may include garnet-based phosphors, silicate-based phosphors, nitride-based phosphors, or oxynitride-based phosphors.

For example, the garnet-based phosphors may be YAG ($Y_3Al_5O_{12}$:$Ce^{3+}$) or TAG ($Tb_3Al_5O_{12}$:$Ce^{3+}$). The silicate-based phosphors may be (Sr, Ba, Mg, Ca)$_2$SiO$_4$: $Eu^{2+}$. The nitride-based phosphors may be CaAlSiN$_3$:$Eu^{2+}$ containing SiN. The oxynitride-based phosphors may be $Si_{6-x}Al_xO_xN_{8-x}$:$Eu^{2+}$ ($0 \leq x \leq 6$).

Light of a first wavelength range emitted from the light emitting device 100 is excited by the phosphors 350, so that it is changed into light of a second wavelength range. As the light of the second wavelength range passes through a lens (not shown), the optical path thereof may be changed.

A plurality of light emitting device packages, each of which has the above-described structure according to the illustrated embodiment, is prepared, and is then arrayed on a substrate. Optical members, namely, light guide plates, prism sheets, diffusion sheets, etc., may be arranged on optical paths of the light emitting device packages. Such light emitting device packages, substrate, and optical members may function as a light unit. In accordance with another embodiment, a display apparatus, an indication apparatus or a lighting system may be implemented using the semiconductor light emitting devices or light emitting device packages described in conjunction with the above-described embodiments. The lighting system may include, for example, a lamp or a street lamp.

Hereinafter, a lighting apparatus, a head lamp, and a backlight unit as embodiments of the lighting system including the above-described light emitting device packages will be described.

Figure 12:
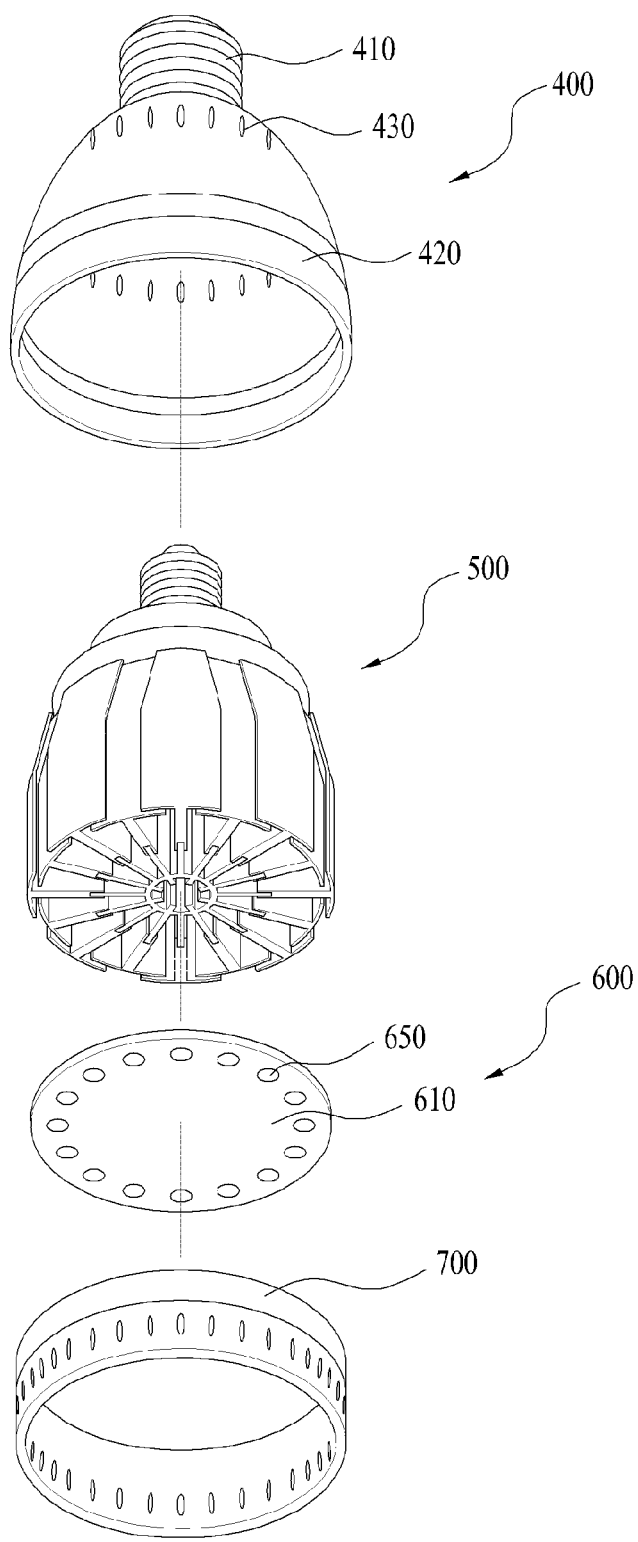
FIG. 12 is an exploded perspective view illustrating a lighting apparatus according to an exemplary embodiment, in which light emitting device packages according to the above-described embodiment are disposed.

FIG. 12 is an exploded perspective view illustrating a lighting apparatus according to an exemplary embodiment, in which light emitting device packages according to the above-described embodiment are disposed.

Referring to FIG. 12, the lighting apparatus according to the illustrated embodiment includes a light source 600 for projecting light, a housing 400 in which the light source 600 is mounted, a heat dissipation unit 500 for dissipating heat generated from the light source 600, and a holder 700 for coupling the light source 600 and heat dissipation unit 500 to the housing 400.

The housing 400 includes a socket connection part 410 connected to an electric socket (not shown), and a body part 420 connected to the socket connection part 410. The light source 600 is received in the body part 420. A plurality of air holes 430 may be formed through the body part 420.

Although a plurality of air holes 430 are formed through the body part 420 of the housing 400 in the illustrated case, a single air hole 430 may be formed through the body part 420. Although the plural air holes 430 are circumferentially arranged, various arrangements thereof may be possible.

The light source 600 includes a circuit board 610 and a plurality of light emitting device packages 650 mounted on the circuit board 610. The light emitting device packages 650 may have a structure described with reference to FIG. 11.

The holder 700 is disposed under the light source 600. The holder 700 includes a frame and air holes. Although not shown, an optical member may be disposed under the light source 600 so as to diffuse, scatter or converge light projected from the light emitting device packages 650 of the light source 600.

Figure 13:
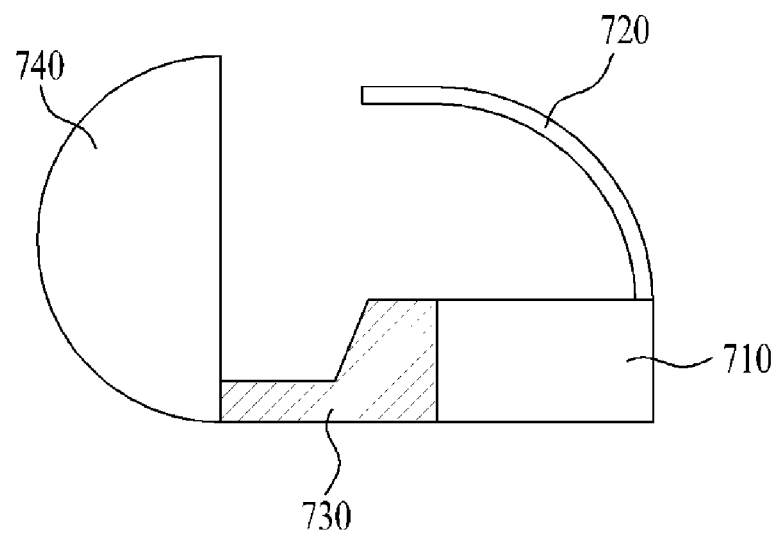
FIG. 13 is a view illustrating a head lamp according to an exemplary embodiment, in which a light emitting device package according to the above-described embodiment is disposed.

FIG. 13 is a view illustrating a head lamp according to an exemplary embodiment, in which a light emitting device package according to the above-described embodiment is disposed.

Referring to FIG. 13, light emitted from a light emitting module 710, in which a light emitting device package according to the above-described embodiment is disposed, passes through a lens 740 after being reflected by a reflector 720 and a shade 730, so as to be directed forwardly of a vehicle body.

A plurality of light emitting devices may be mounted in the light emitting device package included in the light emitting module 710, although the present disclosure is not limited thereto.

Since the light emitting device package, which includes the light emitting device according to one of the above-described embodiments, has an enhanced light extraction efficiency in accordance with the thickness reduction of the first-conductivity-type semiconductor layer, the luminous efficacy of the light emitting module 710 may be enhanced.

Figure 14:
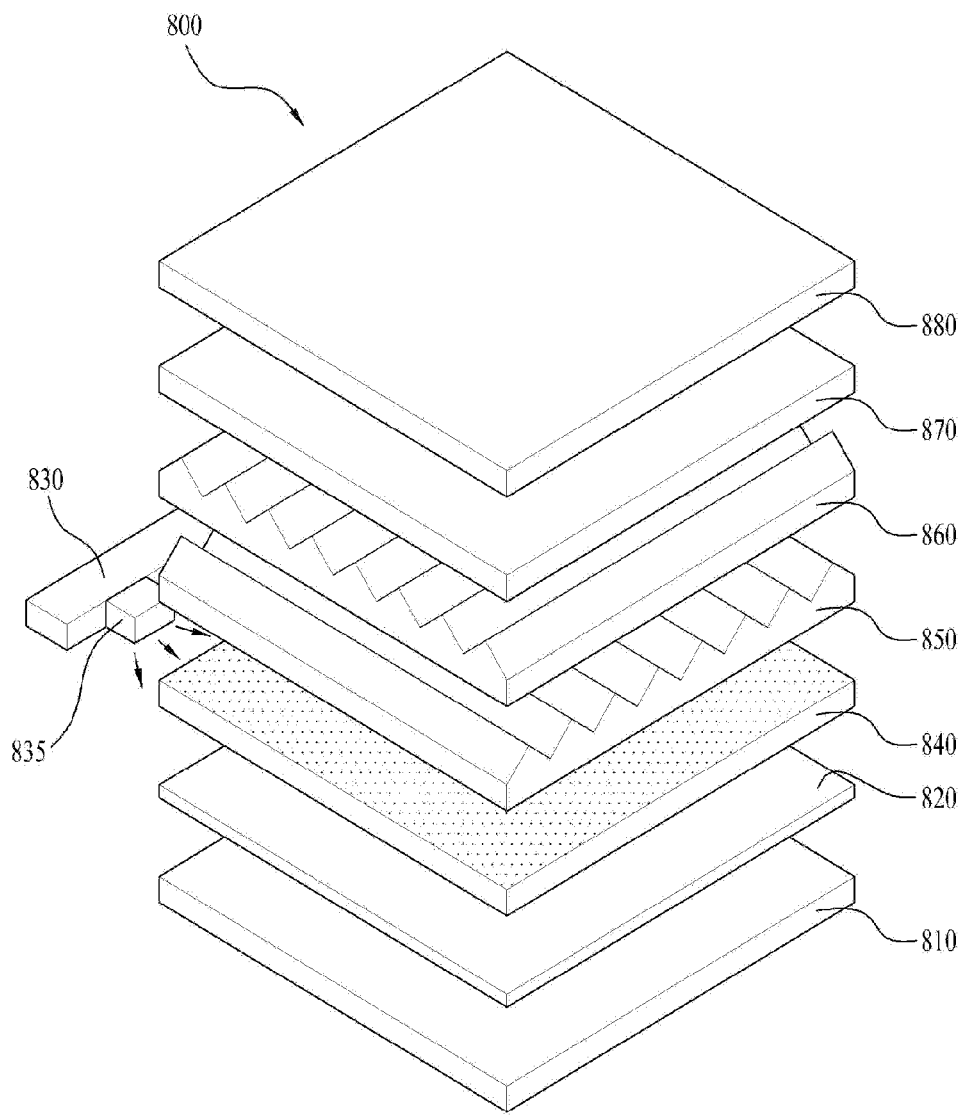
FIG. 14 is a view illustrating a display apparatus according to an exemplary embodiment in which light emitting device packages according to the above-described embodiment are disposed.

FIG. 14 is a view illustrating a display apparatus according to an exemplary embodiment in which light emitting device packages according to the above-described embodiment are disposed.

As shown in FIG. 14, the display apparatus according to the illustrated embodiment, which is designated by reference numeral "800", includes a light source module, a reflection plate 820 disposed on a bottom cover 810, a light guide plate 840 disposed in front of the reflection plate 820 to guide light emitted from the light source module to a front side of the display apparatus 800, first and second prism sheets 850 and 860 disposed in front of the light guide plate 840, a panel 870 disposed in front of the second prism sheet 860, and a color filter 880 disposed in front of the panel 870.

The light source module includes a circuit board 830 and light emitting device packages 835 mounted on the circuit board 830. Here, a printed circuit board (PCB) may be used as the circuit board 830. The light emitting device packages 835 may have the configuration described above in conjunction with FIG. 11.

The bottom cover 810 serves to receive the constituent elements of the display apparatus 800. The reflection plate 820 may be provided as a separate element, as shown in FIG. 14, or may be formed as a material having high reflectivity is coated over a rear surface of the light guide plate 840 or a front surface of the bottom cover 810.

Here, the reflection plate 820 may be made of a material having high reflectivity and capable of being formed into an ultra thin structure. Polyethylene terephthalate (PET) may be used for the reflection plate 820.

The light guide plate 840 serves to scatter light emitted from the light source module so as to uniformly distribute the light throughout all regions of a liquid crystal display apparatus. Therefore, the light guide plate 840 may be made of a material having high refractivity and transmissivity. The material of the light guide plate 840 may include polymethylmethacrylate (PMMA), polycarbonate (PC) or polyethylene (PE). The light guide plate may be dispensed with. In this case, an air guide system, which transfers light in a space over the reflective sheet 820, may be implemented.

The first prism sheet 850 may be formed by coating a polymer exhibiting light transmittance and elasticity over one surface of a base film. The first prism sheet 850 may have a prism layer having a plurality of three-dimensional structures in the form of a repeated pattern. Here, the pattern may be of a stripe type in which ridges and valleys are repeated.

The second prism sheet 860 may have a similar structure to the first prism sheet 850. The second prism sheet 860 may be configured such that the orientation direction of ridges and valleys formed on one surface of the base film of the second prism sheet 860 is perpendicular to the orientation direction of the ridges and valleys formed on one surface of the base film of the first prism sheet 850. Such a configuration serves to uniformly distribute light transmitted from the light module and the reflective sheet 820 toward the entire surface of the panel 870.

In the illustrated embodiment, an optical sheet may be constituted by the first prism sheet 850 and second prism sheet 860. However, the optical sheet may include other combinations, for example, a microlens array, a combination of a diffusion sheet and a microlens array, and a combination of a prism sheet and a microlens array.

A liquid crystal display panel may be used as the panel 870. Further, instead of the liquid crystal display panel 870, other kinds of display devices requiring light sources may be provided.

The display panel 870 is configured such that a liquid crystal layer is located between glass bodies (transparent substrates), and polarizing plates are mounted on both glass bodies so as to utilize polarizing properties of light. Here, the liquid crystal layer has properties between a liquid and a solid. That is, in the liquid crystal layer, liquid crystals which are organic molecules having fluidity like the liquid are regularly oriented, and the liquid crystal layer displays an image using change of such molecular orientation due to an external electric field.

The liquid crystal display panel used in the display apparatus is of an active matrix type, and uses transistors as switches to adjust voltage applied to each pixel.

The color filter 880 is provided on the front surface of the panel 870, and transmits only a red, green or blue light component of light projected from the panel 870 per pixel, thereby displaying an image.

As apparent from the above description, in the light emitting device according to each of the above-described embodiments, the semiconductor layer thereof has a reduced thickness. Accordingly, the light extraction efficiency of the light emitting device may be enhanced because the length of a path, along which light generated from an active layer travels before being outwardly emitted, is reduced.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a light emitting structure comprising a first-conductivity-type semiconductor layer, an active layer, and a second-conductivity-type semiconductor layer;
   a second electrode layer disposed beneath the light emitting structure and electrically connected to the second-conductivity-type semiconductor layer;
   a first electrode layer comprising a main electrode disposed beneath the second electrode layer, and at least one contact electrode branching from the main electrode and extending through the second electrode layer, the second-conductivity-type semiconductor layer and the active layer, to contact the first-conductivity-type semiconductor layer; and
   an insulating layer interposed between the first electrode layer and the second electrode layer and between the first electrode layer and the light emitting structure,
   wherein the first-conductivity-type semiconductor layer comprises a first region and a second region, the first region directly contacts the contact electrode, and a width of the first region is greater than a width of the contact electrode, and
   wherein a thickness of the first region in a vertical direction is greater than a thickness of the second region in a vertical direction.

2. The light emitting device according to claim 1, wherein the width of the first region corresponds to 1 to 5 times the width of the contact electrode.

3. The light emitting device according to claim 1, wherein a roughness or a pattern is formed at an upper surface of the first-conductivity-type semiconductor layer.

4. light emitting device according to claim 1, further comprising:
   a passivation layer formed on side surfaces of the light emitting structure, to cover at least a portion of the second-conductivity-type semiconductor layer, at least a portion of the active layer, and at least a portion of the first-conductivity-type semiconductor layer.

5. The light emitting device according to claim 4, wherein the passivation layer is further formed on side surfaces of the first region.

6. The light emitting device according to claim 1, wherein a roughness is formed at least a portion of a top surface of the contact electrode.

7. The light emitting device according to claim 1, wherein a portion of the second electrode layer is exposed outside the light emitting structure, and an electrode pad is disposed on the exposed portion of the second electrode layer.

8. The light emitting device according to claim 7, wherein the second electrode layer comprises a current spreading layer, and the electrode pad contacts the current spreading layer.

9. The light emitting device according to claim 1, wherein the second electrode layer comprises at least one of an ohmic layer or a reflective layer.

10. The light emitting device according to claim 1, wherein the first region has at least one of a stripe shape, a circular prism shape, a conical shape, a pyramid shape, a square prism shape, or a hemi-spherical shape.

11. The light emitting device according to claim 1, wherein a width of the second region is higher than the width of the contact electrode.

12. The light emitting device according to claim 1, wherein a top surface of the first region is higher than a top surface of the second region.

13. The light emitting device according to claim 1, wherein a top surface of the first region is higher than a top surface of the contact electrode.

14. The light emitting device according to claim 1, wherein a top surface of the second region is higher than a top surface of the contact electrode.

15. A light emitting device comprising:
a light emitting structure comprising a first-conductivity-type semiconductor layer, an active layer, and a second-conductivity-type semiconductor layer;
a second electrode layer disposed beneath the light emitting structure and electrically connected to the second-conductivity-type semiconductor layer;
a first electrode layer comprising a main electrode disposed beneath the second electrode layer, and at least one contact electrode branching from the main electrode and extending through the second electrode layer, the second-conductivity-type semiconductor layer and the active layer, to contact the first-conductivity-type semiconductor layer; and
an insulating layer interposed between the first electrode layer and the second electrode layer and between the first electrode layer and the light emitting structure,
wherein the first-conductivity-type semiconductor layer comprises a first region and a second region, the first region is vertically overlapped with the contact electrode, and a width of the first region is less than a width of the second region, and
wherein the second region is vertically non-overlapped with the contact electrode, wherein a top surface of the first region is higher than a top surface of the second region.

16. The light emitting device according to claim 15, wherein a width of the contact electrode is smaller than a width of the first region.

17. The light emitting device according to claim 15, wherein a distance between a top surface of the contact electrode and a top surface of the first region is higher than a distance between the active layer and a top surface of the second region.

18. A lighting apparatus comprising:
a light source for emitting light, the light source comprising a plurality of light emitting device packages mounted on a circuit board;
a housing, in which the light source is mounted;
a heat dissipation unit to dissipate heat generated from the light source; and
a holder for coupling the light source and the heat dissipation unit to the housing,
wherein each of the light emitting device packages comprises a body, first and second lead frames disposed on the body, and a light emitting device disposed on the body and electrically connected to the first and second lead frames,
wherein the light emitting device comprises a light emitting structure comprising a first-conductivity-type semiconductor layer, an active layer, and a second-conductivity-type semiconductor layer, which are stacked in a predetermined direction; a second electrode layer disposed beneath the light emitting structure and electrically connected to the second-conductivity-type semiconductor layer;
a first electrode layer comprising a main electrode disposed beneath the second electrode layer, and at least one contact electrode branching from the main electrode and extending through the second electrode layer, the second-conductivity-type semiconductor layer and the active layer, to contact the first-conductivity-type semiconductor layer; and an insulating layer interposed between the first electrode layer and the second electrode layer and between the first electrode layer and the light emitting structure, and
wherein the first-conductivity-type semiconductor layer comprises a first region and a second region, the first region directly contacts the contact electrode, and a width of the first region is higher than a width of the contact electrode.

19. The lighting apparatus according to claim 18, wherein a roughness is formed at least a portion of a top surface of the contact electrode.

* * * * *